United States Patent
Cho (10) Patent No.: US 7,616,487 B2
(45) Date of Patent: Nov. 10, 2009

(54) DECODERS AND DECODING METHODS FOR NONVOLATILE SEMICONDUCTOR MEMORY DEVICES

(75) Inventor: Ji-Ho Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 174 days.

(21) Appl. No.: 11/933,702

(22) Filed: Nov. 1, 2007

(65) Prior Publication Data
US 2008/0106941 A1    May 8, 2008

(30) Foreign Application Priority Data
Nov. 2, 2006    (KR)    ...................... 10-2006-0107555

(51) Int. Cl.
*G11C 16/06*    (2006.01)
(52) U.S. Cl. ............................ 365/185.13; 365/185.23; 365/189.11; 365/230.06
(58) Field of Classification Search ............ 365/185.13, 365/185.23, 230.06, 189.11, 203
See application file for complete search history.

(56) References Cited
U.S. PATENT DOCUMENTS

| | | | |
|---|---|---|---|
| 5,668,758 A | 9/1997 | Yiu et al. | |
| 5,880,995 A | 3/1999 | Kobatake | |
| 5,991,198 A | 11/1999 | Song et al. | |
| 6,088,286 A | 7/2000 | Yamauchi et al. | |
| 6,166,987 A | 12/2000 | Atsumi et al. | |
| 6,356,481 B1 | 3/2002 | Micheloni et al. | |
| 6,542,406 B2 | 4/2003 | Byeon et al. | |
| 6,587,375 B2 * | 7/2003 | Chung et al. ........... | 365/185.13 |
| 6,791,878 B2 | 9/2004 | Jeong | |
| 6,985,399 B2 | 1/2006 | Lee | |
| 7,012,836 B2 | 3/2006 | Matsubara et al. | |
| 7,423,910 B2 * | 9/2008 | Umezawa .............. | 365/185.23 |

* cited by examiner

*Primary Examiner*—Huan Hoang
(74) *Attorney, Agent, or Firm*—Myers Bigel Sibley & Sajovec, P.A.

(57) ABSTRACT

A decoder for a non-volatile semiconductor memory device includes a level shifter configured to generate a negative first voltage at an output thereof responsive to a first state of a global word line and to generate a second voltage more positive than the first voltage responsive to a second state of the global word line. The decoder further includes a local word line driver having an input coupled to the output of the level shifter and configured to apply a voltage on a partial word line to a local word line when the output of the level shifter is at the first voltage and to apply the first voltage to the local word line when the output of the level shifter is at the second voltage.

15 Claims, 10 Drawing Sheets

DECODERS AND DECODING METHODS FOR NONVOLATILE SEMICONDUCTOR MEMORY DEVICES

CROSS-REFERENCE TO RELATED APPLICATION

This application claims priority under 35 U.S.C. § 119 from Korean Patent Application 2006-107555, filed on Nov. 2, 2006, the disclosure of which is hereby incorporated by reference herein in its entirety.

FIELD OF THE INVENTION

The present invention relates to semiconductor memory devices and, more particularly, to nonvolatile semiconductor memory devices.

BACKGROUND OF THE INVENTION

Flash memory devices typically are electrically erasable and/or programmable and are often used for data storage in relatively large units. Flash memory is widely used, for example, for storing a basic input/output system (BIOS) in place of a hard disk, for storing a communication protocol in a mobile phone, as an image memory in a digital camera, and other storage applications.

NOR-type flash memory devices typically have a significantly greater programming and read speed in comparison to other types of nonvolatile memory devices. A typical NOR-type flash memory device includes memory cells positioned at respective intersections of word lines and bit lines. Each memory cell typically includes a control gate and a floating gate positioned between a source region and a drain region. The control gates typically are coupled to word lines, the drain regions are typically coupled in common to a bit line, and the source region is typically grounded. The floating gate typically is disposed between a channel region and the control gate.

Figure 1:
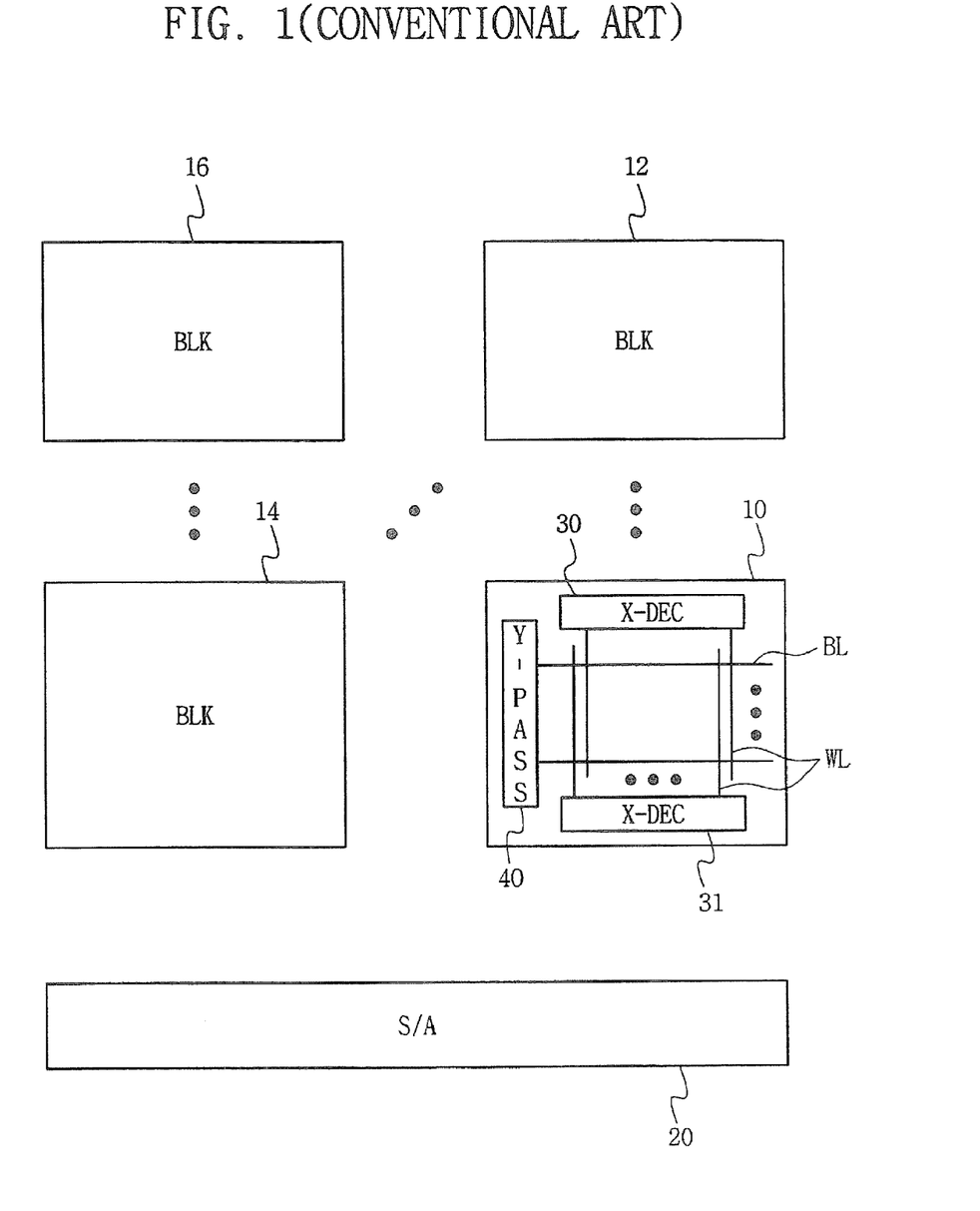
FIG. 1 is a schematic block diagram illustrating a sense amplifier and a memory block of a conventional NOR type flash memory device.

FIG. 1 is a block diagram schematically illustrating a conventional NOR-type flash memory device. Memory blocks BLK, 10, 12, 14 and 16 and a sense amplifier (S/A) 20 are illustrated. For example, the memory block 10 may have 512K memory cells, the number of word lines WL may be 1024 and the number of bit lines BL may be 512. The word lines are connected to row decoders X-DEC, 30 and 31, and the bit lines are selectively connected to the sense amplifier 20 through a column pass circuit Y-PASS 40 in response to a column decoded signal output from a column decoder. A row decoder may select one word line and a column decoder may select one bit line. The sense amplifier 20 senses whether a selected cell is an "off" cell or "on" cell, amplifying a bit line voltage according to a state of a memory cell connected to a selected word line and selected bit line.

Figure 2:
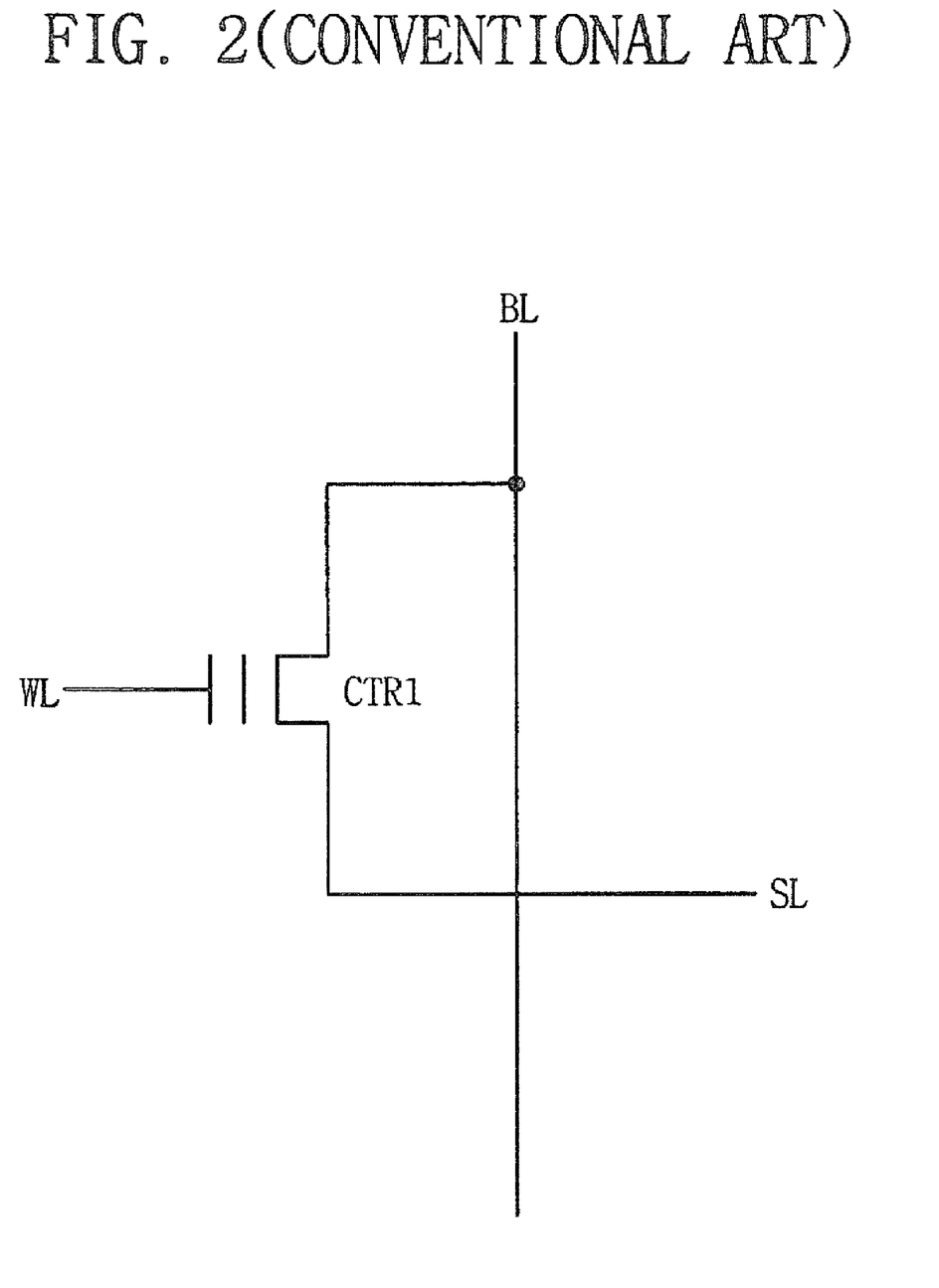
FIG. 2 is a circuit diagram illustrating a memory cell in the memory device shown in FIG. 1.

FIG. 2 is a circuit diagram illustrating a memory cell of a memory block of the memory device of FIG. 1. A memory cell includes a cell transistor CTR1. The cell transistor CTR1 includes a control gate and a floating gate. The control gate is connected to a word line WL. A drain of the cell transistor CTR1 is connected to a bit line BL and a source is connected to a ground terminal through a source line SL.

Figure 3:
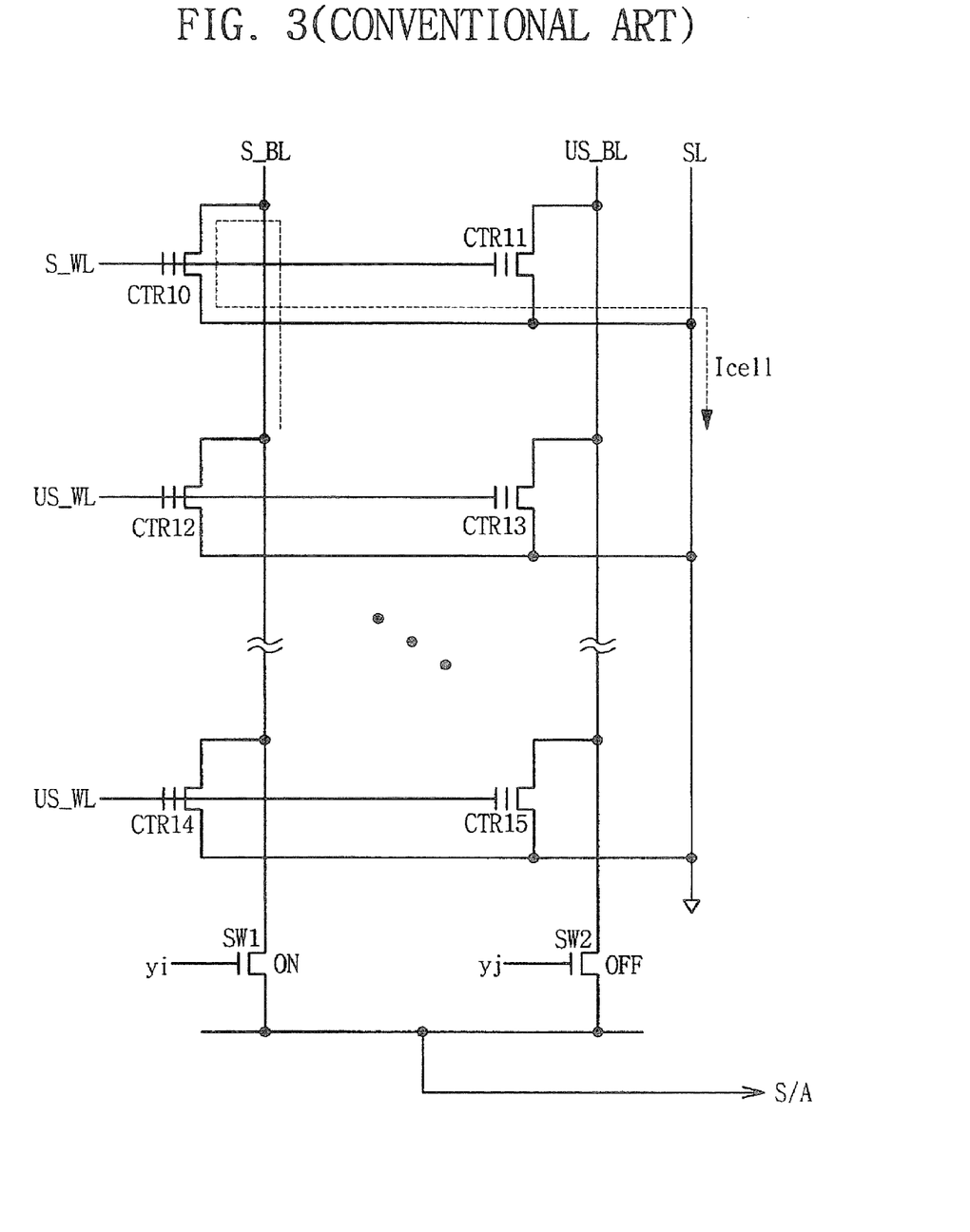
FIG. 3 is a circuit diagram illustrating a read operation of a conventional NOR type flash memory device.

FIG. 3 is a circuit diagram illustrating a conventional read operation of a NOR-type flash memory device as illustrated in FIGS. 1 and 2. When a cell transistor CTR10 is selected, a word line S_WL and a bit line S_BL connected to the cell transistor CTR10 are selected. Other word lines US_WL connected to other cell transistors CTR12-15 in other rows of cell transistors are unselected, and a bit line US-BL connected to cell transistors CTR11, CTR13, CTR15 is unselected. The selected bit line S_BL is selected by coupling it to the sense amplifier S/A using a column pass transistor SW1 in response to a column selection signal yi. The unselected bit line US-BL is disconnected from the sense amplifier S/A by turning off a column pass transistor SW2 in response to another column selection signal yj.

In a read operation, when a voltage, e.g., 5V, is applied to the selected word line S_WL, and 0V is applied to the unselected word lines US_WL, and the selected cell transistor CTR10 connected to the selected word line S_WL and the selected bit line S_BL is an "off" cell, cell current Icell may be approximately 0, which causes the voltage of the selected word line S_BL, which is precharged, to remain at a logic "high" value. If the selected cell transistor CTR10 is an "on" cell, cell current Icell has a larger value which, after passage of a certain amount of time, causes the voltage of the selected bit line S_BL to approach a logic "low." To read a state of the selected cell, the sense amplifier S/A is turned on at an appropriate time point in response to the column selection signal yi and performs a sense and amplification operation.

Figure 4:
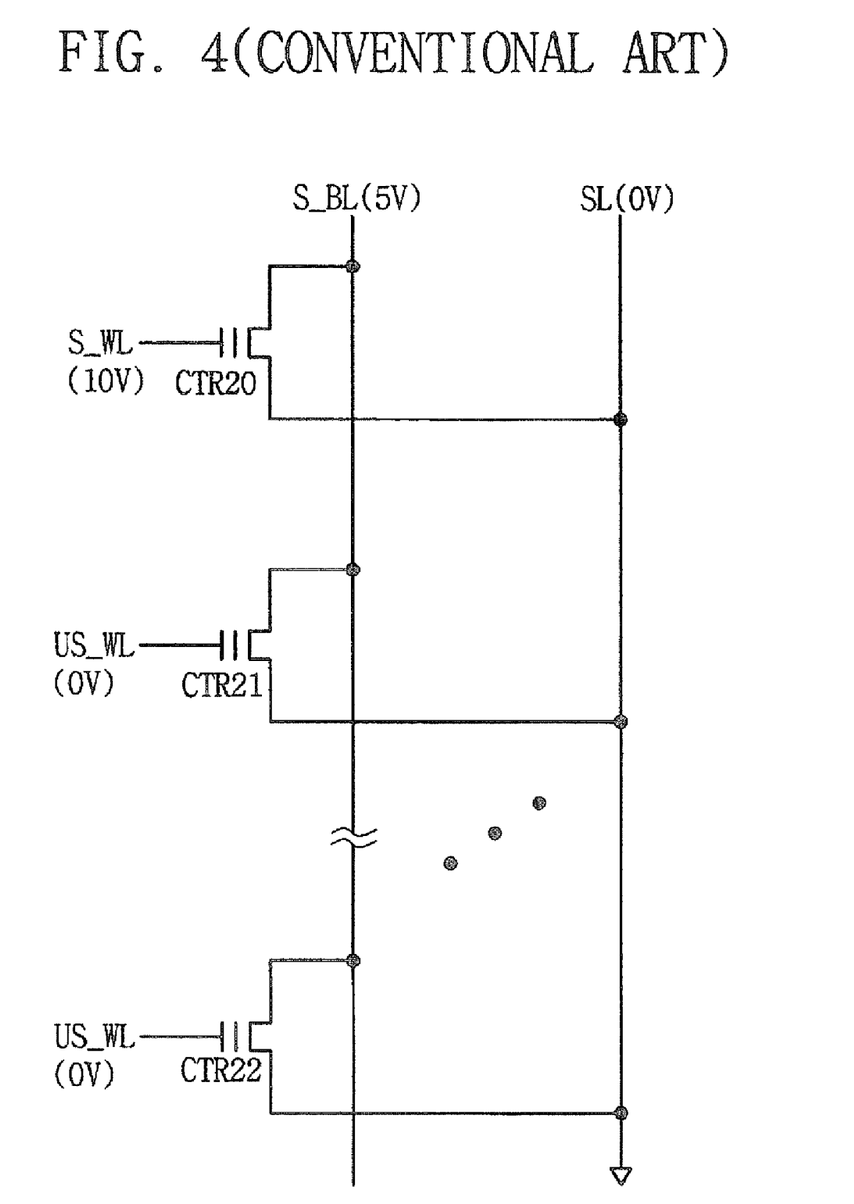
FIG. 4 is a circuit diagram illustrating a write operation of a conventional NOR type flash memory device.

FIG. 4 is a circuit diagram illustrating a conventional program operation of a NOR-type flash memory device. To program a selected cell transistor CTR20 connected to a word line S_WL and a bit line S_BL to an "off" condition, a program voltage, for example, 10V, is applied to the selected word line S_WL. A bias voltage, for example, 5V, is applied to the selected bit line S_BL, while unselected word lines US_WL connected to unselected cell transistors CTR21, CTR22, a source line SL, and unselected bit lines (not shown) are grounded. This bias condition supports a program scheme using a channel hot electron (CHE) injection, in which a threshold voltage of cell transistor is increased by injecting hot electrons into a floating gate of the selected cell CTR20. The programmed flash memory cell CTR20 prevents current flow from a drain region thereof to a source region thereof.

Figure 5:
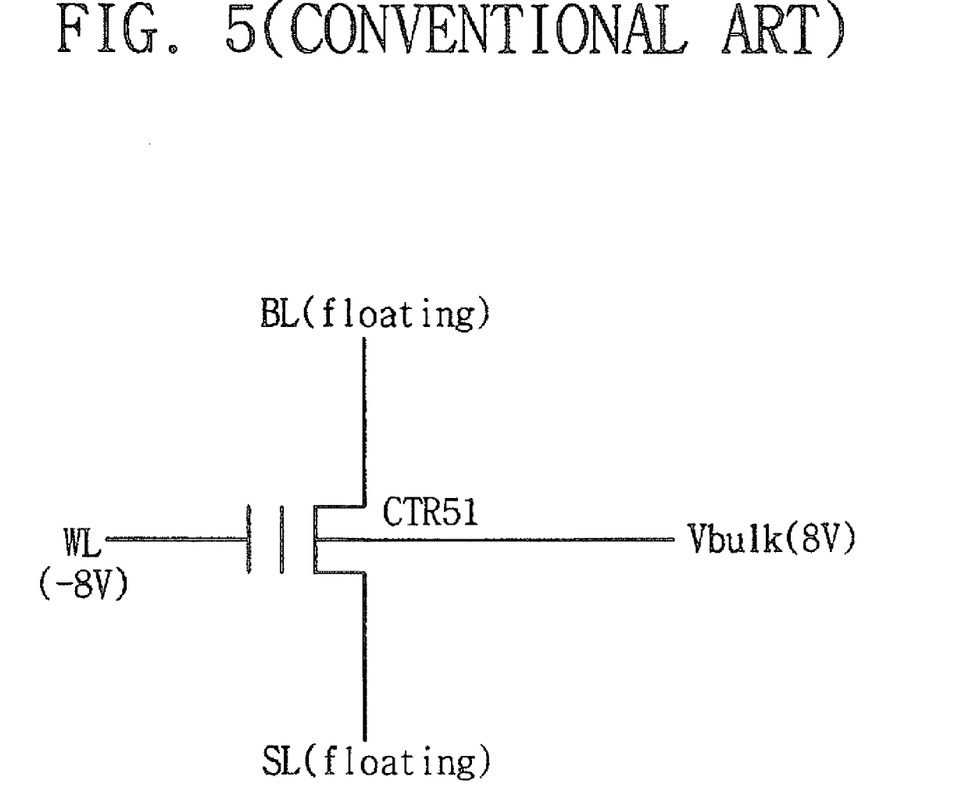
FIG. 5 is a circuit diagram illustrating an erase operation of a conventional NOR type flash memory device.

FIG. 5 is a circuit diagram illustrating a conventional erase operation for a NOR-type flash memory device. To erase a memory cell transistor CTR51, a bit line BL and a source line SL are floated. A negative voltage, for example, −8V, is applied to a word line WL. A bulk voltage Vbulk, for example, 8V, is applied to a substrate of the cell transistor CTR51. The word line voltage and substrate (bulk) voltage are examples, and other voltage levels may be used. Electrons in the floating gate move via Fowler-Nordheim (FN) tunneling through a tunnel oxide layer to the semiconductor substrate. The tunneling may be induced by forming a relatively high electric field between the floating gate of the memory cell CTR51 and the semiconductor substrate.

As described above, a high electric field is typically generated between a floating gate of memory cell and a semiconductor substrate, thereby generating the Fowler-Nordheim tunneling (F-N tunneling) toward the semiconductor substrate When electrons in the floating gate excessively tunnel through the semiconductor substrate, the threshold voltage of cell transistor may be taken below 0V, which may be referred to as over erase. Over erase may cause a drain turn-on failure, which can prevent accurate reading of a cell.

Figure 6:
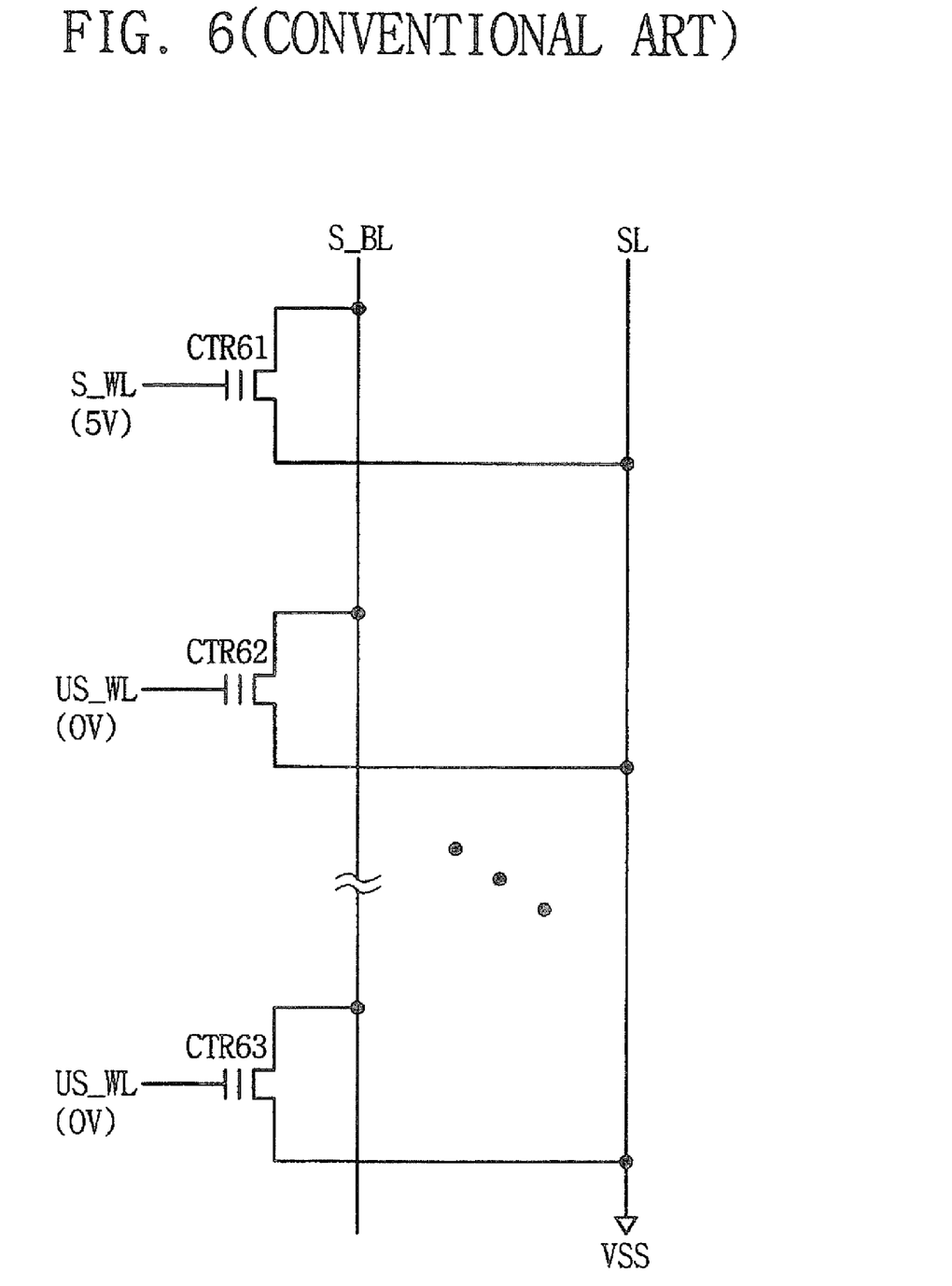
FIG. 6 is a circuit diagram illustrating peripheral cells of cells over erased in an erase operation.
Figure 7:
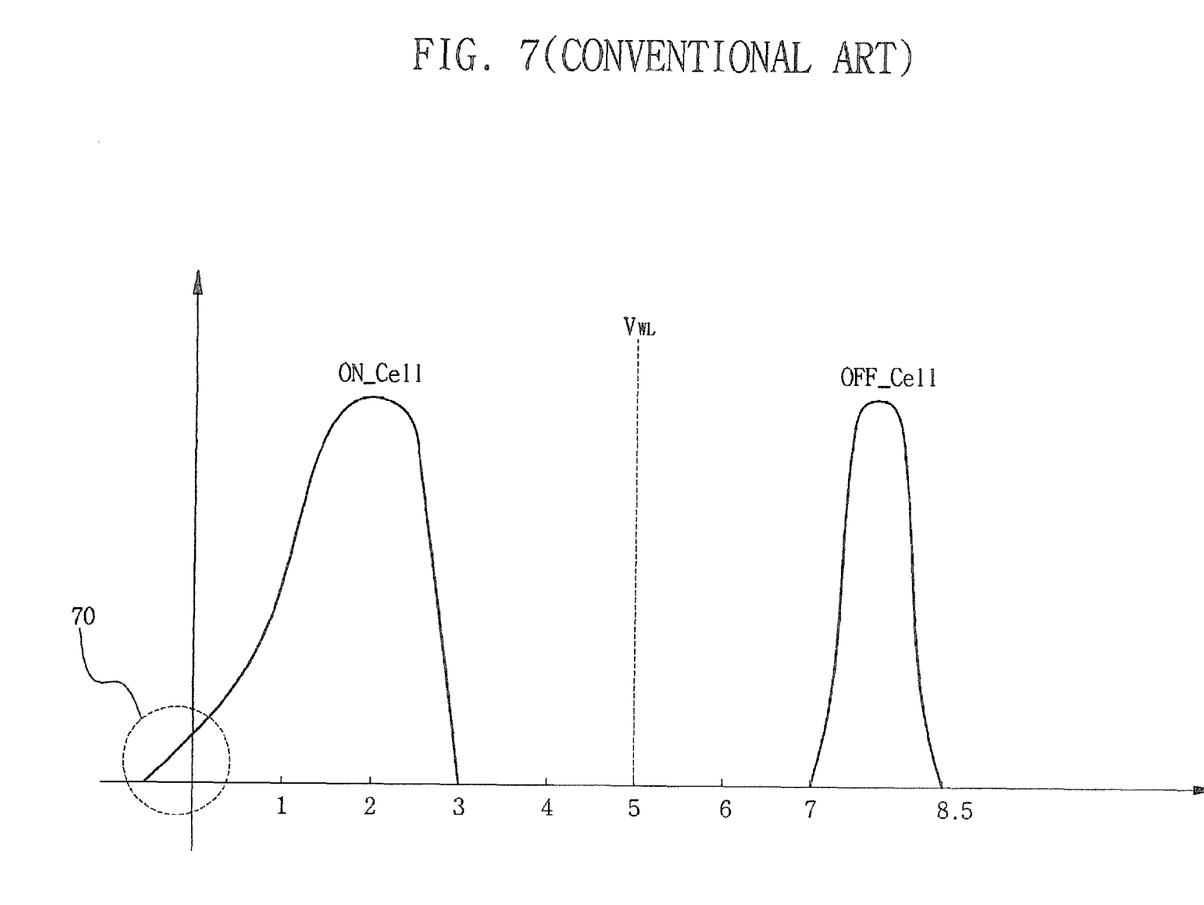
FIG. 7 is a graph illustrating a threshold voltage distribution of cells including over erased cells as illustrated in FIG. 6.

FIGS. 6 and 7 are drawings that illustrate such a failure. In particular, FIG. 6 is a circuit diagram showing peripheral cells adjacent to the over erased cells in an erase operation, and FIG. 7 is a graph illustrating the threshold voltage distribution of the over erased cells. Referring to FIGS. 6 and 7, if a cell CTR62 is over erased, the threshold voltage distribution may be illustrated as shown in FIG. 7. In particular, the threshold voltage of the over erased cell CTR62 may fall into the region 70 of the threshold voltage distribution. In this case, when 5V is applied to a word line S_WL of a selected cell transistor CTR61 and word lines US_WL connected to unselected cells CTR62, CTR63 are grounded, the over erased cell CTR62 may be turned on because of its low threshold voltage.

Assuming that the selected cell CTR61 is an "off" cell, the current flowing into the grounded terminal through the source line SL from the selected bit line S_BL would be close to 0 if there were no over erased cells. However, when the unselected cell CTR62 is over erased, current passes through the unselected cell CTR62 and, consequently, the selected cell CTR61 is erroneously read as "on" cell. Such erroneous turn-on may occur in a writing operation as well.

Figure 8:
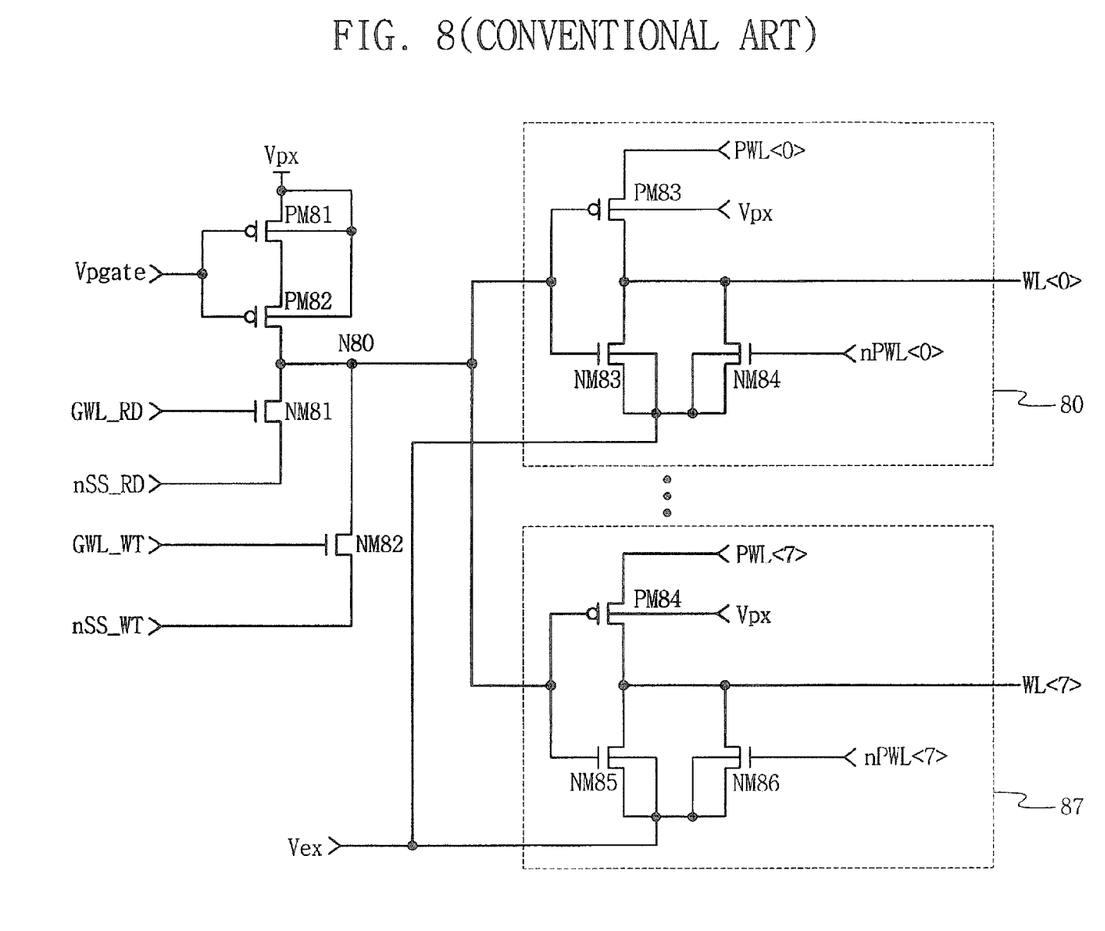
FIG. 8 is a circuit diagram illustrating a conventional decoder.

FIG. 8 is a detailed circuit diagram illustrating a decoder for driving the word lines as shown in FIG. 6. A read global word line GWL_RD is used to select a set of local word lines WL<0>-WL<7> in a read operation and a write global word line GWL_WT is used to select local word lines WL<0>-WL<7> in a write (program) operation. In read and write operations, the local word lines WL<0>-WL<7> are driven responsive to partial word lines PWL<0>-PWL<7>.

The decoder selects one local word line by combination of signals that are applied to the global word line and the partial word line. For example, to select the local word line WL<0> in a reading operation, the read global word line GWL_RD is driven to a "high" level, thereby turning on an NMOS transistor NM81. The current driving capability of the PMOS transistors PM81, PM82 is less than that of the NMOS transistor NM81, causing the node N80 to be driven from a voltage Vpx towards the voltage of a line nSS_RD, which is held at around 0V in a read operation. With reference to the node N80, the node N80 maintains voltage of Vpx in a normal operation, and voltage of 0V when selecting the global word line GWL_RD or GWL_WT.

When a partial word line PWL<0> is selected, the corresponding local word line WL<0> is driven to the same voltage as the partial word line PWL<0>, e.g., around 5V. The other partial word lines PWL<1>-PWL<7> are held at around 0V, such that the local word lines WL<1>-WL<7> are driven to around 0V.

If neither the read global word line GWL_RD nor the write global word line GWL_WT is selected, the node N80 has a voltage of Vpx and, consequently, the NMOS transistors NM83, NM85 of the local word line drivers 80-87 are turned on. If the partial word lines PWL<0>-PWL<7> are held at around 0V, complementary partial word lines nPWL<0>-nPWL<7> have a complementary voltage VCC, thereby turning on the NMOS transistors NM84, NM86. As a result, the local word lines WL<0>-WL<7> are driven to an external voltage Vex, which may be, for example, a ground voltage.

However, as described above, if memory cells connected to anyone of local word lines are over erased, a drain turn-on problem may occur because the ground voltage applied to unselected word lines may cause an error as discussed above.

SUMMARY OF THE INVENTION

Some embodiments of the present invention provide decoders for use in a non-volatile semiconductor memory device. According to some embodiments, a decoder includes a level shifter configured to generate a negative first voltage at an output thereof responsive to a first state of a global word line and to generate a second voltage more positive than the first voltage responsive to a second state of the global word line. The decoder further includes a local word line driver having an input coupled to the output of the level shifter and configured to apply a voltage on a partial word line to a local word line when the output of the level shifter is at the first voltage and to apply the first voltage to the local word line when the output of the level shifter is at the second voltage. The first voltage may be sufficiently negative to prevent turn on of a memory cell coupled to the local word line when the output of the level shifter is at the second voltage.

In some embodiments, the level shifter includes an input node pre-charge circuit configured to precharge an input node of the level shifter and to discharge the input node responsive to the global word line and a voltage shift circuit configured to generate the first and second voltages responsive to a voltage at the input node. According to some embodiments, the local word line driver includes a PMOS transistor having a gate coupled to the output of the level shifter, a source coupled to the partial word line and a drain coupled to the local word line and an NMOS transistor having a gate coupled to the output of the level shifter, a drain coupled to the local word line, and a source coupled to a node having the first voltage. The first voltage may be sufficient to turn on the PMOS transistor.

Additional embodiments of the present invention provide a decoder including a plurality of level shifters, respective ones of which are coupled to respective global word lines and each of which is configured to generate a negative first voltage at an output thereof responsive to a first state of the global word line coupled thereto and to generate a second voltage more positive than the first voltage responsive to a second state of the global word line coupled thereto. The decoder further includes groups of local word line drivers, the local word line drivers of respective ones of the groups having inputs coupled to respective ones of the outputs of the level shifters, each local word line driver configured to apply a voltage on a partial word line coupled thereto to a local word line coupled thereto when the output of the level shifter coupled thereto is at the first voltage and to apply the first voltage to the local word line coupled thereto when the output of the level shifter coupled thereto is at the second voltage.

Further embodiments of the present invention provide methods of operating a non-volatile semiconductor memory device that comprises a plurality of groups of local word lines, respective ones of which are selected by respective global word lines. A read or write voltage is applied to a first local word line of first group of local word lines via a corresponding partial word line responsive to selection of the corresponding global word line while applying a ground voltage to other local word lines of the first group of local word lines via respective corresponding partial word lines. A negative voltage is applied to local word lines of other groups of groups of local word lines responsive to nonselection of their corresponding global word lines. Applying a negative voltage to local word lines of other groups of groups of local word lines responsive to nonselection of their corresponding global word lines may include decoupling the other groups of local word lines from respective corresponding partial word lines responsive to nonselection of their corresponding global word lines. The negative voltage may be sufficiently negative to prevent turn on of memory cells coupled to the local word lines of the other groups of local word lines. Some embodiments provide decoders that can reduce a drain turn-on problem that is generated after an over erase is performed in an erase operation of a non-volatile memory device.

DETAILED DESCRIPTION OF EMBODIMENTS OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the sizes or configurations of elements may be idealized or exaggerated for clarity. It will be understood that when an element is referred to as being "connected to" or "coupled to" another element, it may be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, region or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

Figure 9:
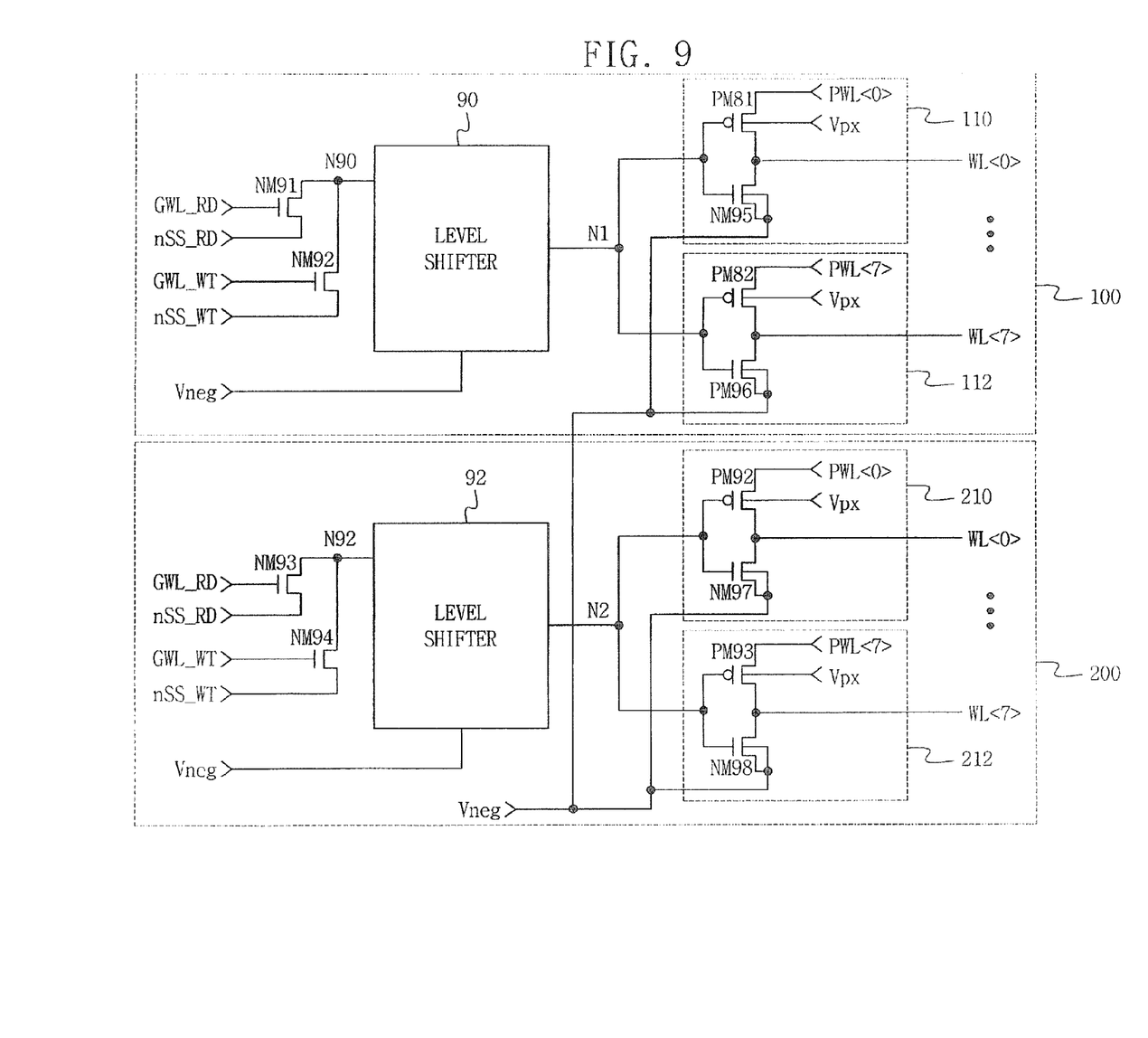
FIG. 9 is a circuit diagram illustrating a decoder of a non volatile memory device according to some embodiments of the present invention.

FIG. 9 is a view illustrating a decoder of a non-volatile memory device according to some embodiments of the present invention. The nonvolatile memory device includes local word lines WL<0>-WL<7> connected to respective ones of a plurality of memory cells. The local word lines WL<0>-WL<7> are arranged in a plurality of groups 100, 200 that are selected by respective corresponding read global word lines GWL_RD and write global word lines GWL_WT. The decoder includes a plurality of level shifters 90, 92 and local word line drivers 110, 112, 210, 212. A level shifter 90, for example, provides a voltage, for example, a positive power supply voltage VCC, to the first node N1 when the read global word line GWL_RD or write global word line GWL_WT at an input terminal of the level shifter 90 is not selected, and a negative voltage Vneg, which is sufficient to turn on a PMOS transistor of a local word line driver, to the first node N1 when the read global word line GWL_RD or write global word line GWL_WT is selected.

Figure 10:
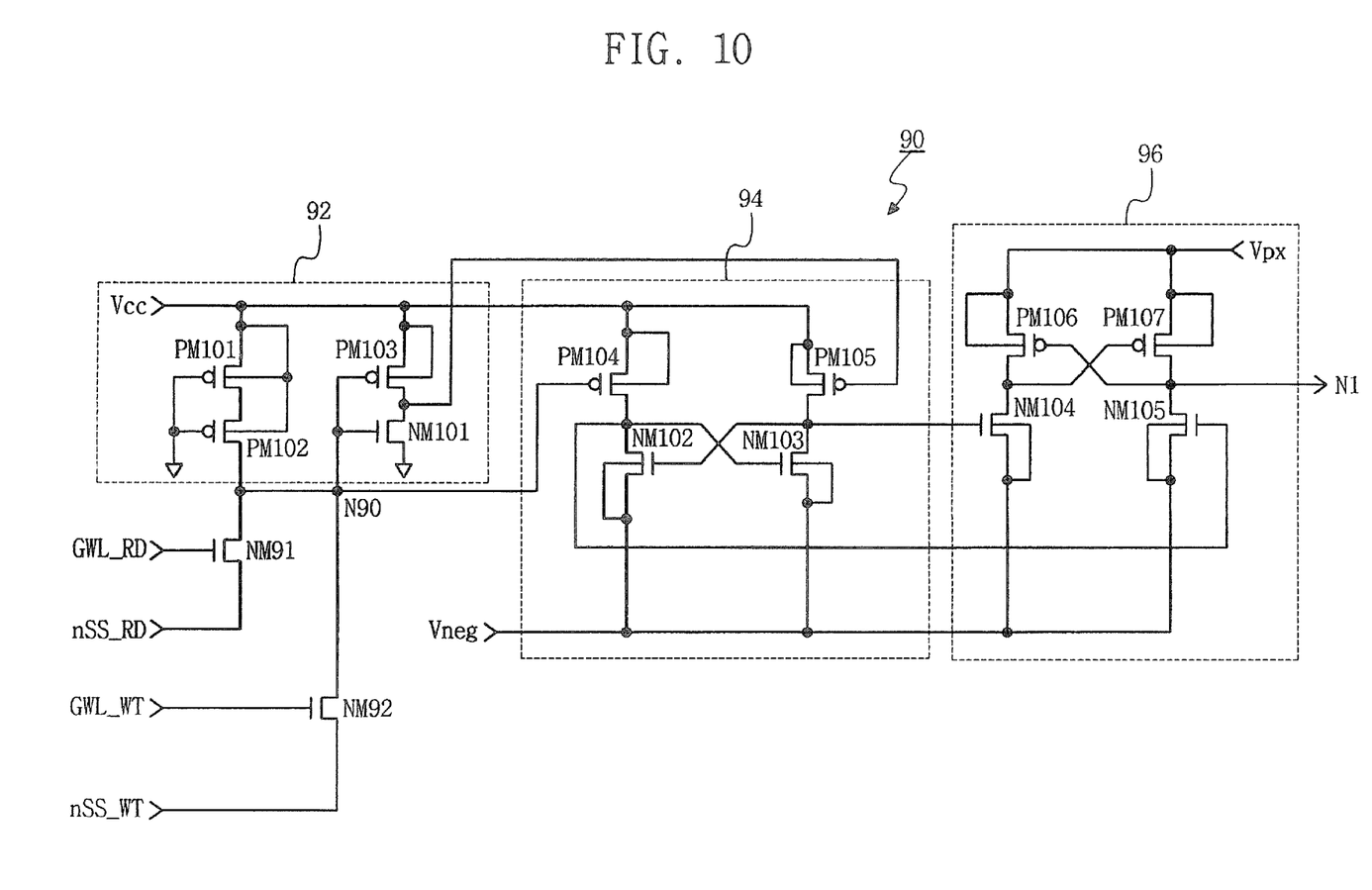
FIG. 10 is a circuit diagram of a level shifter for the memory device of FIG. 9 according to further embodiments of the present invention.

A level shifter 90 is shown in FIG. 10. The level shifter 90 includes an input node precharge circuit 92 and first and second voltage shift circuits 94, 96. The first voltage shift circuit 94 includes PMOS transistors PM104, PM105 and NMOS transistors NM102, NM103. The second voltage shift circuit 96 includes PMOS transistors PM106, PM107 and NMOS transistors NM104, NM105. The voltage shift circuits 94, 96 illustrated are examples, and may take a number of other, different forms.

The input node precharge circuit 92 precharges the input terminal N90 of the level shifter 90 when the connected read global word line GWL_RD or write global word line GWL_WT is not selected. When the connected read global word line GWL_RD or write global word line GWL_WT is not selected, a positive power supply voltage VCC is provided to the input terminal N90 of the level shifter through a PMOS transistors PM101, PM102 whose gates are grounded. If the connected read global word line GWL_RD or write global word line GWL_WT is selected, NMOS transistor NM91 or NMOS transistor NM92 is turned on, thereby driving the voltage of the input terminal N90 to a voltage of a line nSS_RD or nSS_WT. The line nSS_RD may be maintained, for example, at a ground voltage of around 0V in a read mode and the line nSS_WT may be maintained, for example, at a ground voltage of around 0V in a program (write) mode.

The voltage shift circuits 94, 96 apply the negative voltage Vneg to the first node N1 when the connected read global word line GWL_RD or write global word line GWL_WT is selected. In the illustrated embodiments, when the node N90 is at a low level of around 0V, the PMOS transistor PM104 and the NMOS transistor NM105 are turned on, thereby driving the first node N1 to the negative voltage Vneg. When the node N90 has the default voltage VCC, the first node N1 is driven to a more positive voltage Vpx.

Referring again to FIG. 9, a local word line driver 110 includes a PMOS transistor PM81 and an NMOS transistor NM95. The gate of the PMOS transistor PM81 is connected to the first node N1, while its source is connected to the partial word line PWL<0> and its drain is connected to the drain of the NMOS transistor NM95. The gate of the NMOS transistor NM95 is connected to the first node N1, while its drain is connected to the drain of the PMOS transistor PM81 and its source is coupled to the line providing the first negative voltage Vneg. Local word line drivers 112, 210, 212 include PMOS transistors PM82, PM92, PM93 and NMOS transistors NM96, NM97, NM98 that are similarly arranged.

When a read global word line GWL_RD associated with the local word line driver 110 is selected and the local word line WL<0> is selected, the first node N1 is driven to the negative voltage Vneg and the local word line WL<0> may be driven to a positive voltage applied via the partial word line PWL<0>. The positive voltage may be, for instance, 5V in a read mode and 10V in a program mode.

The other local word lines WL<1>-WL<7> may be unselected by applying a voltage to the corresponding partial word lines PWL<1>-PWL<7> that is higher than the negative voltage Vneg but lower than the positive voltage applied to the partial word line PWL<0> corresponding to the selected local word line WL<0>. For example, a ground voltage of around 0V may be applied to the non-selected partial word lines PWL<1>-PWL<7> in a read mode or in a program mode.

When the first node N1 is at the more positive voltage Vpx, all of the local word lines PWL<1>-PWL<7> are driven to the negative voltage Vneg.

In greater detail, if a read global word line GWL_RD or a write global word line GWL_WT associated with a group of local word lines 100 is selected, and a read global word line GWL_RD and a write global word line GWL_WT associated with the second group of local word lines 200 are unselected, the output node N2 is driven to the more positive voltage Vpx, which turns on the NMOS transistors NM97, NM98 of the local word line drivers 210, 212 to thereby drive the local word lines WL<0>-WL<7> of the second group 200 to the negative voltage Vneg, which may be, for example, −2V. The corresponding partial word lines PWL<0>-PWL<7> of the group 200 may be provided with ground voltage of around 0V.

In some embodiments of the present invention, a decoder of a nonvolatile memory device is provided with a plurality of local word line drivers and a plurality of level shifters, respective ones of which correspond to respective pairs of read and write global word lines GWL_RD, GWL_WT. The level shifters provide a negative voltage Vneg to connected word line drivers when the corresponding read global word line GWL_RD or the corresponding write global word line GWL_WT is selected and provide a more positive voltage Vpx to the connected word line drivers when the corresponding global word lines are not selected.

In addition, each of the local word line drivers receives the voltage of the first node N1 and signals of the corresponding partial word lines PWL<0>-PWL<7> thereby providing a signal (for instance, 5V in a read mode and 10V in a program mode) of the corresponding partial word line to the corresponding local word line in a case where the corresponding local word line is selected, a signal (for instance, 0V in the case of the non selected local word line) of the corresponding partial word line to the non selected local word line in a case where the corresponding local word line is not selected and the selected local word line and global word line are common, and the first voltage Vneg to the local word line in a case where the corresponding local word line is not selected and the selected local word line and global word line are not common, that is, in a case where the global word line is not selected.

Accordingly, a decoder of a non volatile memory device according to some embodiments of the present invention may provide a negative voltage to a non selected word line, causing it to remain unselected even though threshold voltage becomes lowered due to over erase, thereby potentially reducing drain turn-on problems.

Referring to FIGS. 9 and 10, decoding operations according to some embodiments of the present invention include: (1) selecting one local word line (e.g., local word line WL<0> of the first group 100) by providing an operational voltage through a corresponding partial word line (e.g., partial word line PWL<0> corresponding to the first group 100) when an associated read or write global word line (e.g., read global word line GWL_RD or write global word line GWL_WT associated with the group 100) is selected; (2) providing a ground voltage of around 0V to non-selected partial word lines (e.g., partial word lines PWL<1>-PWL<7> associated with the first group 100); and (3) providing a negative voltage Vneg to non-selected local word lines (e.g., local word lines WL<0>-WL<7> of the second group 200). The negative voltage Vneg may be a voltage level capable of turning on PMOS transistors forming local word line drivers connected to each of the non selected local word lines which are common to the selected local word lines and global word lines. Thus, decoding methods according to some embodiments of the present invention may reduce drain turn-on problems caused by over erase by providing a sufficiently negative voltage to non-selected local word lines.

As described above, according to some embodiments of the invention, decoders and methods may reduce drain turn-on problems arising from over erasing of memory cells. In particular, when reading or writing data of peripheral cells after memory cells connected to local word lines are erased, some embodiments of the present invention may reduce over erase problems.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A decoder for use in a non-volatile semiconductor memory device, the decoder comprising:
    a level shifter configured to generate a negative first voltage at an output thereof responsive to a first state of a global word line and to generate a second voltage more positive than the first voltage responsive to a second state of the global word line; and
    a local word line driver having an input coupled to the output of the level shifter and configured to apply a voltage on a partial word line to a local word line when the output of the level shifter is at the first voltage and to apply the first voltage to the local word line when the output of the level shifter is at the second voltage.

2. The decoder of claim 1, wherein the level shifter comprises:
    an input node pre-charge circuit configured to precharge an input node of the level shifter and to discharge the input node responsive to the global word line; and a voltage shift circuit configured to generate the first and second voltages responsive to a voltage at the input node.

3. The decoder of claim 1, wherein the local word line driver comprises:
a PMOS transistor having a gate coupled to the output of the level shifter, a source coupled to the partial word line and a drain coupled to the local word line; and
an NMOS transistor having a gate coupled to the output of the level shifter, a drain coupled to the local word line, and a source coupled to a node having the first voltage.

4. The decoder of claim 3, wherein the first voltage is sufficient to turn on the PMOS transistor.

5. The decoder of claim 1, wherein the first voltage is sufficiently negative to prevent turn on of a memory cell coupled to the local word line when the output of the level shifter is at the second voltage.

6. The decoder of claim 1, wherein the second voltage is positive.

7. A decoder for use in a non-volatile semiconductor memory device, the decoder comprising:
a plurality of level shifters, respective ones of which are coupled to respective global word lines and each of which is configured to generate a negative first voltage at an output thereof responsive to a first state of the global word line coupled thereto and to generate a second voltage more positive than the first voltage responsive to a second state of the global word line coupled thereto; and
groups of local word line drivers, the local word line drivers of respective ones of the groups having inputs coupled to respective ones of the outputs of the level shifters, each local word line driver configured to apply a voltage on a partial word line coupled thereto to a local word line coupled thereto when the output of the level shifter coupled thereto is at the first voltage and to apply the first voltage to the local word line coupled thereto when the output of the level shifter coupled thereto is at the second voltage.

8. The decoder of claim 7, wherein each level shifter comprises:
an input node pre-charge circuit configured to precharge an input terminal of the level shifter and to discharge the input terminal responsive to the global word line; and
a voltage shift circuit configured to generate the first and second voltages responsive to a voltage at the input node.

9. The decoder of claim 7, wherein each local word line driver comprises:
a PMOS transistor having a gate coupled to the output of the level shifter, a source coupled to the partial word line and a drain coupled to the local word line; and
an NMOS transistor having a gate coupled to the output of the level shifter, a drain coupled to the local word line, and a source coupled to a node having the first voltage.

10. The decoder of claim 9, wherein the first voltage is sufficient to turn on the PMOS transistor.

11. The decoder of claim 7, wherein the first voltage is sufficiently negative to prevent turn on of a memory cell coupled to the local word line when the output of the level shifter is at the second voltage.

12. The decoder of claim 7, wherein the second voltage is positive.

13. A method of operating a non-volatile semiconductor memory device that comprises a plurality of groups of local word lines, respective ones of which are selected by respective global word lines, the method comprising:
applying a read or write voltage to a first local word line of first group of local word lines via a corresponding partial word line responsive to selection of the corresponding global word line while applying a ground voltage to other local word lines of the first group of local word lines via respective corresponding partial word lines; and
applying a negative voltage to local word lines of other groups of groups of local word lines responsive to nonselection of their corresponding global word lines.

14. The method of claim 13, wherein applying a negative voltage to local word lines of other groups of groups of local word lines responsive to nonselection of their corresponding global word lines comprises decoupling the other groups of local word lines from respective corresponding partial word lines responsive to nonselection of their corresponding global word lines.

15. The method of claim 13, wherein the negative voltage is sufficiently negative to prevent turn on of memory cells coupled to the local word lines of the other groups of local word lines.

* * * * *